(12) United States Patent
Walecki

(10) Patent No.: US 10,584,958 B2
(45) Date of Patent: Mar. 10, 2020

(54) ERROR REDUCTION IN MEASUREMENT OF SAMPLES OF MATERIALS

(71) Applicant: APPLEJACK 199 L.P., Milpitas, CA (US)

(72) Inventor: Wojciech Jan Walecki, Sunrise, FL (US)

(73) Assignee: APPLEJACK 199 L.P., Milpitas, CA (US)

( * ) Notice: Subject to any disclaimer, the term of this patent is extended or adjusted under 35 U.S.C. 154(b) by 0 days.

(21) Appl. No.: 16/165,451

(22) Filed: Oct. 19, 2018

(65) Prior Publication Data
US 2020/0049488 A1 Feb. 13, 2020

Related U.S. Application Data

(60) Provisional application No. 62/716,827, filed on Aug. 9, 2018.

(51) Int. Cl.
*G01B 11/06* (2006.01)
(52) U.S. Cl.
CPC .............................. *G01B 11/0691* (2013.01)
(58) Field of Classification Search
CPC .................................................. G01B 11/0691
USPC .................................................. 356/600–640
See application file for complete search history.

(56) References Cited

U.S. PATENT DOCUMENTS

| 7,116,429 B1 | 10/2006 | Walecki et al. |
| 7,502,121 B1 | 3/2009 | Walecki et al. |
| 9,915,564 B1 | 3/2018 | Walecki et al. |

OTHER PUBLICATIONS

D. Huang, E. A. Swanson, C. P. Lin, J. S. Schuman, W. G. Stinson, W. Chang, M. R. Hee, T. Flotte, K. Gregory, C. A. Puliafito, J. G. Fujimoto, "Optical coherence tomography," Science 254, 1178-1181 (1991). 5 pgs.
W. Walecki, et al. "Non-Contact Fast Wafer Metrology for Ultra-Thin Patterned Wafers Mounted on Grinding Dicing Tapes", SEMI® Technology Symposium: International Electronics Manufacturing Technology IEMT), San Jose, Jul. 16, 2004. 3pgs.
W.J. Walecki, R. Lu, J. Lee, M. Watman, S.H. Lau, and A. Koo, "Novel Non-contact Wafer Mapping Metrologies for Thin and Ultrathin Chip Manufacturing Applications", 3rd International Workshop on Semiconductor Devices—Manufacturing and Applications, Munich, Germany, Nov. 25, 2002. 19 pgs.
W. J. Walecki, V. Souchkov, K. Lai, P. Van, M. Santos, A. Pravdivtsev, S. H. Lau, and A. Koo, "Novel Noncontact Thickness Metrology for Partially Transparent and Nontransparent Wafers for Backend Semiconductor Manufacturing" in Progress in Compound Semiconductor Materials IV—Electronic and Optoelectronic Applications, edited by G.J. Brown, M.O. Manasreh, C. Gmachl, R.M. Biefeld, K. Unterrainer (Mater. Res. Soc. Symp. Proc. 829, Warrendale, PA, 2004), B9.31. 6 Pgs.
W. J. Walecki, K. Lai, V. Souchkov, P. Van, SH Lau, and A. Koo, "Novel noncontact thickness metrology for backend manufacturing of wide bandgap light emitting devices", phys. stat. sol. (c) 2, No. 3, 984-989 (2005). 6 pgs.

(Continued)

*Primary Examiner* — Tri T Ton
(74) *Attorney, Agent, or Firm* — Maschoff Brennan

(57) ABSTRACT

Operations related to error reduction in measurement of samples of materials may include operations in which a first distance measurement may be obtained between a first probe and a first surface of a sample at a first time mark. Additionally, the operations may include obtaining a second distance measurement between a second probe and a second surface of the sample at a second time mark. Operations may further include obtaining a third distance measurement between the first probe and the first surface of a sample at a third time mark, and determining a fourth distance measurement between the first probe and the first surface of the sample at the second time mark. In addition, the operations may include determining a thickness of the sample, including an error term due to vibration of the sample. The error term may be discounted from the thickness of the sample.

22 Claims, 4 Drawing Sheets

(56) References Cited

OTHER PUBLICATIONS

W. Walecki, F. Wei, P. Van, K. Lai, T. Lee, SH Lau, and A. Koo, "Novel Low Coherence Metrology for Nondestructive Characterization of High Aspect Ratio Micro-fabricated and Micro-machined Structures" Reliability, Testing and Characterization MEMS/MOEMS III, edited by D. M. Tanner and R. Ramesham, Proc. SPIE 5343, 55 (2003). 9pgs.

W. Walecki, Low Coherence Interferometry Based Metrologies for MEMS Manufacturing, SEMI Technology Symposium: Innovations in Semiconductor Manufacturing (STS: ISM), Jul. 13, San Francisco, 2004. 15 Pgs.

W. Walecki, F. Wei, P. Van, K. Lai, T. Lee, V. Souchkov, S.H. Lau, and A. Koo "Low Coherence Interferometric Metrology for Ultra-Thin MEMs Structures", in Nanoengineered Assemblies and Advanced Micro/Nanosystems, edited by David P. Taylor, Jun Liu, David McIlroy, Lhadi Merhari, J.B. Pendry, Jeffrey T. Borenstein, Piotr Grodzinski, Luke P. Lee, and Zhong Lin Wang (Mater. Res. Soc. Symp. Proc. 820, Warrendale, PA, 2004), 08.8. 5 pgs.

Wojciech J. Walecki, Frank Wei, Phuc Van, Kevin Lai, Tim Lee, SH Lau, and Ann Koo, "Novel Low Coherence Metrology for Nondestructive Characterization of High Aspect Ratio Micro-fabricated and Micro-machined Structures", Reliability, Testing, and Characterisation of MEMS/MOEMS III, edited by Danelle M. Tanner, Rejeshuni Ramesham, Proceedings of SPIE vol. 5343 p. 55-62 (SPIE, Bellingham, WA, 2004). 9 pgs.

W. J. Walecki, V. Souchkov, K. Lai, T. Wong, T. Azfar, Y. T. Tan, P. Van, S. H. Lau, and A. Koo, "Low-coherence interferometric absolute distance gauge for study MEMs structures" in Reliability, Testing and Characterization MEMS/MOEMS IV, edited by D. M. Tanner and R. Ramesham, Proc. SPIE 5716, 23 (2005). 8pgs.

Walecki, Wojciech J., Alexander Pravdivtsev, Kevin Lai, Manuel Santos, and Ann Koo. "Synchronized low coherence interferometry for in-situ and ex-situ metrology for semiconductor manufacturing." In Optical Diagnostics, vol. 5880, p. 58800H. International Society for Optics and Photonics, 2005. 8pgs.

Walecki, Wojciech J., Kevin Lai, Alexander Pravdivtsev, Vitali Souchkov, Phuc Van, Talal Azfar, Tim Wong, S. H. Lau, and Ann Koo. "Low-coherence interferometric absolute distance gauge for study of MEMS structures." In Reliability, Packaging, Testing, and Characterization of MEMS/MOEMS IV, vol. 5716, pp. 182-189. International Society for Optics and Photonics, 2005. 8 pgs.

Walecki, Wojtek J., Peter S. Walecki, Eve S. Walecki, and Abigail S. Walecki. "Laser metrology for in-situ monitoring of roughness for diffusers for light emitting devices and laser manufacturing." Journal of Laser Applications 29, No. 2 (2017): 022602. 4pgs.

Walecki, Wojtek J., and Alexander Pravdivtsev. "Metrology of semiconductor structures using novel Fabry Perot fringe stretching system." In Applied Optical Metrology II, vol. 10373, p. 103730N. International Society for Optics and Photonics, 2017. 11 pgs.

Walecki, W. J., David N. Fittinghoff, Arthur L. Smirl, and Rick Trebino. "Characterization of the polarization state of weak ultrashort coherent signals by dual-channel spectral interferometry." Optics letters 22, No. 2 (1997): 81-83. 3 pgs.

ERROR REDUCTION IN MEASUREMENT OF SAMPLES OF MATERIALS

CROSS-REFERENCE TO RELATED APPLICATION

This application claims priority to U.S. Provisional Patent Application No. 62/716,827, filed on Aug. 9, 2018, the disclosure of which is incorporated herein by reference in its entirety.

FIELD

The embodiments discussed in this disclosure are related to error reduction in measurement of samples of materials.

BACKGROUND

One of the known mechanisms for measurement of thickness of a sample of material involves usage of low-coherence interferometry based probes or sensors that gauge distance. More specifically, the sensors may be used to obtain a distance between a sensor and the sample of material from which thickness of the sample of material may be determined.

The subject matter claimed in this disclosure is not limited to embodiments that solve any disadvantages or that operate only in environments such as those described above. Rather, this background is only provided to illustrate one example technology area where some embodiments described in this disclosure may be practiced.

SUMMARY

According to one or more aspects of the present disclosure, operations related to error reduction in measurement of samples of materials are disclosed. In some embodiments, the operations may include obtaining, from a spectrometer, a first distance measurement between a first probe and a first surface of a sample at a first time mark, the first probe communicatively coupled to the spectrometer. The operations may also include obtaining, from the spectrometer, a second distance measurement between a second probe and a second surface of the sample at a second time mark that is chronologically after the first time mark, the second distance measurement including velocity and acceleration of the sample at the second time mark relative to the second probe communicatively coupled to the spectrometer.

The operations may also include obtaining, from the spectrometer, a third distance measurement between the first probe and the first surface of the sample at a third time mark that is chronologically after both of the first time mark and the second time mark, the third distance measurement including velocity and acceleration of the sample at the third time mark relative to the first probe. In addition, the operations may include determining a fourth distance measurement between the first probe and the first surface of the sample at the second time mark by averaging the first distance measurement and the third distance measurement, the fourth distance measurement including velocity and acceleration of the sample at the second time mark relative to the first probe.

The operations may further include determining a thickness of the sample by subtracting the sum of the fourth distance measurement and the second distance measurement from a probe separation distance, the probe separation distance a predetermined distance between the first probe and the second probe, and the thickness of the sample including an error term due to vibration of the sample. Additionally, the operations may include discounting the error term from the thickness of the sample to improve estimation accuracy of the thickness of the sample.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
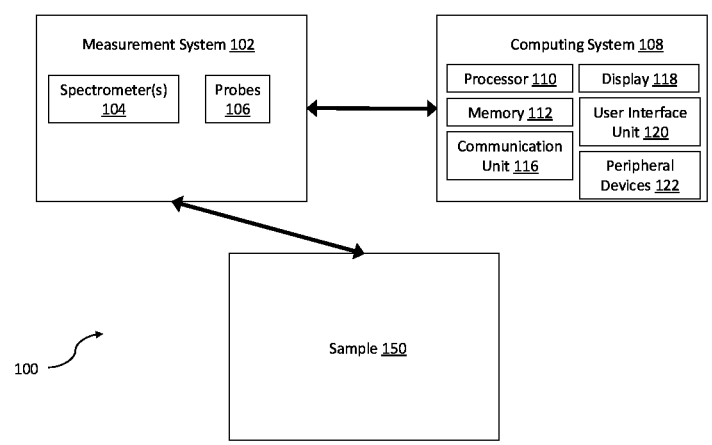
FIG. 1 illustrates an example environment to determine thickness of a sample.

One aspect of quality with respect to a sample of a material may include flatness of the sample. The material of the sample of material may be, for example, a semiconductor device such as any circuit, chip, or device that is fabricated on a silicon substrate wafer, a MEMS structure, or an interconnect feature used in three-dimensional (3-D) packaging. Additionally or alternatively, the material of the sample of material may be, for example, a glass panel. In these or other embodiments, the flatness of the sample may be determined by variation in thickness of the sample. Less variation in thickness may be indicative of a higher degree of flatness of the sample and higher quality of the sample. More variation in thickness may be indicative of a lower degree of flatness of the sample and lower quality of the sample.

There are a variety of methods to measure the thickness of the sample. Some methods may provide more accurate thickness measurements than others. Inaccuracies or error may be introduced into the thickness measurements of a sample as a result of the measurement environment, configuration of a measurement system, measurement system limitations, incorrect parameters or assumptions, user error, etc., or some combination thereof. In some cases, the more accurate methods may be implemented at the expense of increased costs. For example, one method of measuring the thickness of the sample employs a dual-spectrometer system that is highly accurate but also costly to implement. Another method of measuring the thickness of the sample employs a single spectrometer system that is less accurate but also less expensive.

According to an aspect of the present disclosure, a method is disclosed that may reduce the error of the single spectrometer system such that the error in the thickness measurement may be comparable to the dual-spectrometer system yet without the inherent costs of the dual-spectrometer system. In the single spectrometer system, motion of the sample may introduce error into the thickness of the sample. Sample motion has not previously been accounted for in thickness measurements of the sample to the degree of accuracy described in the present disclosure. The present disclosure results in improvements to the technological field of sample manufacturing in addition to technological improvements in a host of devices that receive, use, or require samples. For example, in the technological field of sample manufacturing, many variables go into manufacturing a sample and developing samples. Increased accuracy of sample thickness measurements may allow higher resolution in experiments (e.g., a Design of Experiments) that aid in determining relationships between factors affecting a process and the output of the process (e.g., flatness of the sample). In another example, increased accuracy of sample thickness measurements may increase yields of standard-acceptable samples. In another example, increased accuracy of sample thickness measurements may help ensure that samples with unacceptable defects (e.g., too much thickness variation) do not continue downstream to an end product such as a power semiconductor. In this manner, methods of the present disclosure may improve a reliability and a performance of end products implementing samples.

According to an aspect of the present disclosure, the Taylor series may be implemented in a new way to approximate motion of a sample that occurs while undergoing thickness measurements in a single spectrometer system. The motion of the sample may be a result of industrial environment conditions (e.g., vibration of a factory floor). The approximated motion of the sample may be an amount of error to discount when determining the thickness of the sample.

One of the reasons why the approximated motion is an error term to be discounted from the thickness measurement of the sample is due to the configuration of the single spectrometer system. In the single spectrometer system, a first probe may measure a distance to a first surface of the sample (e.g., a bottom surface), and a second probe may measure a distance to a second surface of the sample (e.g., a top surface) opposite the first surface. Due to implementing only a single spectrometer, the first probe and the second probe may not take measurements simultaneously to determine the thickness of the sample. Rather, the first probe and the second probe may take measurements at distinct points in time, e.g., separated by some amount of time. In between measurements, however, the sample may undergo motion (e.g., harmonic motion). As a result, the motion of the sample introduces error into the thickness measurement of the sample. According to the present disclosure, the motion of the sample is modeled as harmonic motion, which is approximated in this disclosure using the Taylor series.

Turning to the figures, FIG. 1 illustrates an example environment 100 to determine thickness of a sample. The environment 100 may be arranged in accordance with at least one embodiment described in the present disclosure. The environment 100 may include a measurement system 102, a computing system 108, and a sample 150.

The measurement system 102 may include one or more spectrometers 104 and probes 106. The spectrometer 104 may be configured to spectrally analyze reflected light from the sample 150. In these or other embodiments, light may be emitted by the probes 106, reflected from the sample 150, collected by the probes 106, and subsequently analyzed by the spectrometer 104 to determine the spectrum of light reflected from the sample 150. The spectrum of reflected light may be referred to in the present disclosure as a spectral response of the sample 150. The spectral response from the sample 150 may indicate a distance from the probe 106 to the sample 150, a topography of the sample 150, etc. In these or other embodiments, the sample 150 may include a slab of material configured to be etched, diced, etc. and/or may include a finished/partially finished sample product having undergone a manufacturing process. The sample 150 may be non-transparent or substantially non-transparent. In other embodiments, the sample 150 may be transparent or substantially transparent.

In some embodiments, the computing system 108 may be communicatively coupled to the measurement system 102 to take measurements of the sample 150. The computing system 108 may include a processor 110, memory 112, a communication unit 116, a display 118, a user interface unit 120, and a peripheral device 122, which all may be communicatively coupled. In some embodiments, the computing system 108 may be part of any of the systems or devices described in this disclosure. For example, the computing system 108 may be part of the spectrometer 104 and may be configured to perform one or more of the tasks described above with respect to one or more spectrometers 104. As another example, the computing system 108 may be a part of a computer, server, and/or network.

Generally, the processor 110 may include any suitable special-purpose or general-purpose computer, computing entity, or processing device including various computer hardware or software modules and may be configured to execute instructions stored on any applicable computer-readable storage media. For example, the processor 110 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 1, it is understood that the processor 110 may include any number of processors distributed across any number of networks or physical locations that are configured to perform individually or collectively any number of operations described in this disclosure. In some embodiments, the processor 110 may interpret and/or execute program instructions and/or process data stored in the memory 112. In some embodiments, the processor 110 may execute the program instructions stored in the memory 112.

For example, in some embodiments, the processor 110 may execute program instructions stored in the memory 112 that are related to determining a thickness of the sample 150 such that the computing system 108 may perform or direct the performance of the operations associated therewith as directed by the instructions. In these and other embodiments, instructions may be used to perform one or more operations of the method 400 of FIG. 4 described below.

Additionally or alternatively, the processor 110 may be configured to receive a preset range of values of the thickness of the sample 150 that are acceptable and/or unacceptable. In these or other embodiments, an acceptability or non-acceptability of the sample 150 may be based on the preset range of one or both of acceptable values and unacceptable values of the thickness of the sample 150. For example, a thickness of the sample 150 having a value within a preset range of acceptable values may be determined by the processor 110 to be an acceptable sample 150. Additionally or alternatively, a thickness of the sample 150 having a value outside a preset range of unacceptable values may be determined by the processor 110 to be an acceptable sample 150. In another example, a thickness of the sample 150 having a value within a preset range of unacceptable values may be determined by the processor 110 to be an unacceptable sample 150. Additionally or alternatively, a thickness of the sample 150 having a value outside a preset range of acceptable values may be determined by the processor 110 to be an unacceptable sample 150.

In these or other embodiments, the preset range of one or both of acceptable values and unacceptable values may enable the processor 110 to sort samples 150 according to acceptability and non-acceptability of the samples 150. For example, samples 150 having an acceptable thickness based on the preset range of values may be categorized, filtered, and/or sorted as acceptable. Additionally or alternatively, the preset range of one or both of acceptable values and unacceptable values may enable the processor 110 to sort samples 150 according to thickness of the samples 150. For example, samples 150 may be categorized, filtered, and/or sorted according to thickness of the samples 150 (e.g., in order of increasing or decreasing thickness).

The memory 112 may include computer-readable storage media or one or more computer-readable storage mediums for carrying or having computer-executable instructions or data structures stored thereon. Such computer-readable storage media may be any available media that may be accessed by a general-purpose or special-purpose computer, such as the processor 110. By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 110 to perform a certain operation or group of operations as described in this disclosure. In these and other embodiments, the term "non-transitory" as explained in the present disclosure should be construed to exclude only those types of transitory media that were found to fall outside the scope of patentable subject matter in the Federal Circuit decision of *In re Nuijten,* 500 F.3d 1346 (Fed. Cir. 2007). Combinations of the above may also be included within the scope of computer-readable media.

The communication unit 116 may include any component, device, system, or combination thereof that is configured to transmit or receive information over a network. In some embodiments, the communication unit 116 may communicate with other devices at other locations, the same location, or even other components within the same system. For example, the communication unit 116 may include a modem, a network card (wireless or wired), an infrared communication device, a wireless communication device (such as an antenna), and/or chipset (such as a Bluetooth device, an 802.6 device (e.g., Metropolitan Area Network (MAN)), a Wi-Fi device, a WiMax device, cellular communication facilities, etc.), and/or the like. The communication unit 116 may permit data to be exchanged with a network and/or any other devices or systems described in the present disclosure. For example, when the computing system 108 is included with and/or communicatively coupled to the measurement system 102, the communication unit 416 may allow the spectrometer 104 and/or the probes 106 to communicate with the computing system 108.

The display 118 may be configured as one or more displays, like an LCD, LED, or other type of display. The display 118 may be configured to present video, text, numbers, user interfaces, and other data as directed by the processor 110. For example, when the computing system 108 is included with and/or communicatively coupled to the measurement system 102, the display 118 may be configured to present distance measurements or thickness measurements of the sample 150.

The user interface unit 120 may include any device to allow a user to interface with the computing system 108. For example, the user interface unit 120 may include a mouse, a track pad, a keyboard, buttons, and/or a touchscreen, among other devices. The user interface unit 120 may receive input from a user and provide the input to the processor 110. In some embodiments, the user interface unit 120 and the display 118 may be combined.

The peripheral devices 122 may include one or more devices. For example, the peripheral devices may include a sensor, a microphone, and/or a speaker, among other peripheral devices. In these and other embodiments, the microphone may be configured to capture audio. The speaker may broadcast audio received by the computing system 108 or otherwise generated by the computing system 108. The sensor may be configured to sense vibrations in the environment 100 and may include, for example, an accelerometer, a piezoelectric sensor, etc.

Modifications, additions, or omissions may be made to the environment 100 without departing from the scope of the present disclosure. For example, the environment 100 may not include a peripheral device 122 to estimate the vibrations in the environment 100. In these and other embodiments, the vibrations in the environment 100 may be predetermined, estimated, and/or assumed (e.g., predetermined to be at constant frequency without need for continual analysis).

Figure 2:
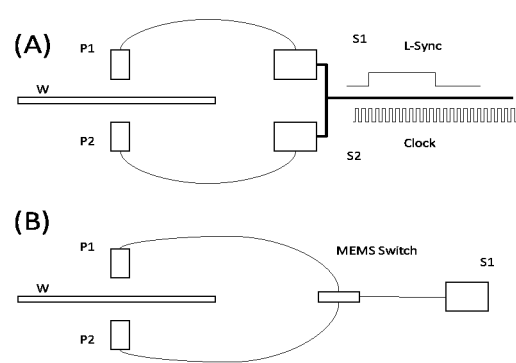
FIG. 2 illustrates two example embodiments of a measurement system described in conjunction with FIG. 1.

FIG. 2 illustrates two example embodiments of the measurement system 102 described above in conjunction with FIG. 1, arranged according to one or more embodiments of the present disclosure. Embodiment "A" illustrates a dual-spectrometer system with spectrometers "S1" and "S2." The spectrometers S1 and S2 may share a clock and trigger signal. Embodiment "B" illustrates a single spectrometer system with spectrometer "S1" communicatively coupled to probes "P1" and "P2" via a micro-electro-mechanical systems (MEMS) switch. In embodiments A and B, the probes P1 and P2 may measure a respective distance to a sample "W." In these or other embodiments, the present disclosure may enable a level of measurement accuracy (e.g., accuracy of distance measurements to the sample W) that is inherent to embodiment A while also enabling cost effectiveness and simplicity that is inherent to embodiment B.

Figure 3:
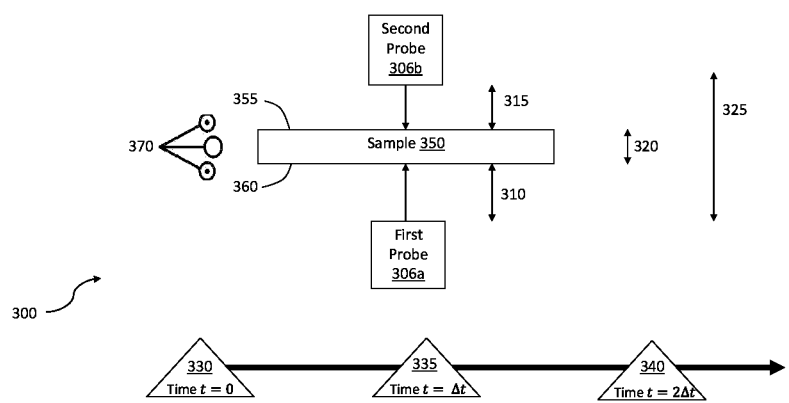
FIG. 3 illustrates an environment to determine sample thickness.

FIG. 3 illustrates an environment 300 to determine sample thickness, arranged according to one or more embodiments of the present disclosure. The environment 300 may include a first probe 306a, a second probe 306b, a first distance 310, second distance 315, a sample thickness 320, a probe separation distance 325, a first time mark 330, a second time mark 335, a third time mark 340, a sample 350 having a first surface 360 and a second surface 355, and sample motion 370. In these or other embodiments, the first probe 306a and the second probe 306b may be the same as or similar to the probes 106 and P2/P1 discussed above in conjunction with FIGS. 1 and 2, respectively. Additionally or alternatively, the sample 350 may be the same as or similar to the sample 150 and W discussed above in conjunction with FIGS. 1 and 2, respectively.

In some embodiments, the sample 350 may undergo the sample motion 370. The sample motion 370 may be a result of industrial environment conditions (e.g., vibration of a factory floor). During sample motion 370, the sample 350 may move such that the first distance 310 and the second distance 315 are in flux. Thus, the sample motion 370 may add complexity and introduce error into what would otherwise be a simple calculation of sample thickness 320 being equal to the probe separation distance 325 minus the sum of the first distance 310 and the second distance 315.

For example, the first probe 306a may measure the first distance 310 to the first surface 355 of the sample 350 (e.g., a bottom surface), and the second probe 306b may measure the second distance 315 to the second surface 360 of the sample 350 (e.g., a top surface) opposite the first surface 355. Due to implementing only a single spectrometer, the first probe 306a and the second probe 306b may not take measurements simultaneously to determine the sample thickness 320. Rather, the first probe 306a and the second probe 306b may take measurements at distinct points in time, e.g., separated by some amount of time. In between measurements, however, the sample 350 may undergo the sample motion 370. As a result, the motion of the sample introduces error into the sample thickness 320 as measured.

According to the present disclosure, the sample motion 370 may be modeled as harmonic motion as a function of time. Since typical vibrations of an environment such as an industrial floor has a frequency spectrum having a high frequency cutoff at about 1-10 Hz, and since the time to acquire a signal in current spectrometers is of the order of about 10 ms, the sample motion 370 may be approximated using the Taylor series as now demonstrated. At the first time mark 330 (e.g., time t=0), a benchmark distance measurement may be taken by the first probe 306a to determine the first distance 310 represented as $H1_0$. Additionally or alternatively, at the first time mark 330 (e.g., time t=0), a benchmark distance measurement may be taken by the second probe 306b to determine the second distance 315 represented as $H1_0$. In these or other embodiments, time t=0 may refer to a time window prior to a trigger, and not necessarily at a particular moment in time (e.g., at the instant of the trigger).

At the second time mark 335 (e.g., t=Δt), the second probe 306b may measure the second distance 315 represented as $$H2(\Delta t) = H2_0 - v*\Delta t - \frac{a*\Delta t^2}{2} + \ldots .$$

In these or other embodiments, $H2_0$ may represent a benchmark distance measurement as the second distance 315 between the second probe 306b and the second surface 355 of the sample 350 at time t=0. Additionally or alternatively, v*Δt may represent a velocity term that includes the velocity of the sample 350 at time t=Δt relative to the second probe 306b. Additionally or alternatively, $$\frac{a\Delta t^2}{2}$$

may represent an acceleration term that includes the acceleration of the sample 350 at time t=Δt relative to the second probe 306b. Additionally or alternatively, * may represent a scalar multiplier, and . . . represents additional terms of a Taylor series approximation.

At the third time mark (e.g., t=2Δt), the first probe 306a may measure the first distance 310 again represented as $$H1(2\Delta t) = H1_0 + v*2\Delta t + \frac{a*(2\Delta t)^2}{2} + \ldots .$$

In these or other embodiments, $H1_0$ may represent a benchmark distance measurement as the first distance 310 between the first probe 306a and the first surface 360 of the sample 350 at time t=0. Additionally or alternatively, v*2Δt may represent a velocity term that includes the velocity of the sample 350 at time t=2Δt relative to the first probe 306a. Additionally or alternatively, $$\frac{a(2\Delta t)^2}{2}$$

may represent an acceleration term that includes the acceleration of the sample 350 at time t=2Δt relative to the first probe 306a.

In determining the sample thickness 320, taking distance measurements from both probes 306a and 306b at the same time (for single spectrometer systems) may be unavailable. Thus, in some embodiments, although the first distance 310 may not be measured by the first probe 306a at the second time mark 335 when the second probe 306b measures the second distance 315, the first distance 310 at the second time mark 335 may be approximated. For example, the first distance 310 at the second time mark 335 may be approximated as an average by interpolating between the first distance 310 at the first time mark 330 and the third time mark 340. The approximation of the first distance 310 at the second time mark 335 may be represented as follows:

$$H1(\Delta t) = \frac{H1_0 + H1(2\Delta t)}{2}.$$

Expanding the terms, $$H1(\Delta t) = \left(H1_0 + H1_0 + v*2\Delta t + \frac{a*(2\Delta t)^2}{2}\right) \Big/ 2.$$

After algebraic manipulation, $H1(\Delta t)=H1_0+v*\Delta t+*a(\Delta t)^2$. In these or other embodiments, $H1(\Delta t)$ may represent the first distance 310 at the second time mark 335.

With the determined first distance 310 at the second time mark 335 (e.g., $H1(\Delta t)$) and the measured second distance 315 at the second time mark (e.g., $H2(\Delta t)$), the sample thickness 320 may be determined. The sample thickness 320 may be approximated by subtracting the sum of the first distance 310 and the second distance 315 from the probe separation distance 325. For example, the sample thickness 320 may be approximated using the following representation: $T_{ap}=H-[H1(\Delta t)+H2(\Delta t)]$. H may represent the probe separation distance 325. Substituting the $H1(\Delta t)$ expression and the $H2(\Delta t)$ expression above into the $T_{ap}$ expression representing the approximation of the sample thickness 320 yields $$T_{ap} = H - \left[(H1_0 + H2_0) + \frac{a(\Delta t)^2}{2}\right].$$

Thus, in some embodiments, the interpolation error when approximating the sample thickness 320 is of the order of $$\frac{a(\Delta t)^2}{2}.$$

The interpolation error may be discounted from sample thickness 320 to improve estimation accuracy of the sample thickness 320.

In these or other embodiments, the obtaining the first distance 310 and/or the second distance 315 at any of the first time mark 330, the second time mark 335, and the third time mark 340 may include obtaining measurements having real-space components and/or frequency domain components. In some embodiments, the frequency domain system in the dual-probe, single spectrometer system may yield similar or better performance (e.g., less error due to vibration) than the real-space system. Some example systems and system configurations with corresponding theoretical error estimations are as follows:

| Type of system and system configuration | Error due to vibration (um) |
|---|---|
| Synchronized system approximately symmetric system | 0.03 |
| Real space not synchronized, asymmetric system | 10 |
| Real space not synchronized, approximately symmetric system | 1.5 |
| Frequency space synchronized dual spectrometer system | 0.01 |
| Frequency space not switching system employing only one spectrometer without correcting for constant speed of the sample | 0.3 |
| Frequency space not switching system employing only one spectrometer with correction for constant speed of the sample according to estimation methods of the present disclosure | 0.01 |

Some example systems and system configurations with corresponding error readouts as actually measured are as follows:

| Type of system and system configuration | Typical observed standard deviation of measured thickness on blanket (um) |
|---|---|
| Real space synchronized system approximately symmetric system | 0.5 |
| Real space not synchronized, approximately symmetric system | 2 |
| Frequency space not switching system employing only one spectrometer without correcting for constant speed of the sample | 0.27 |

Figure 4:
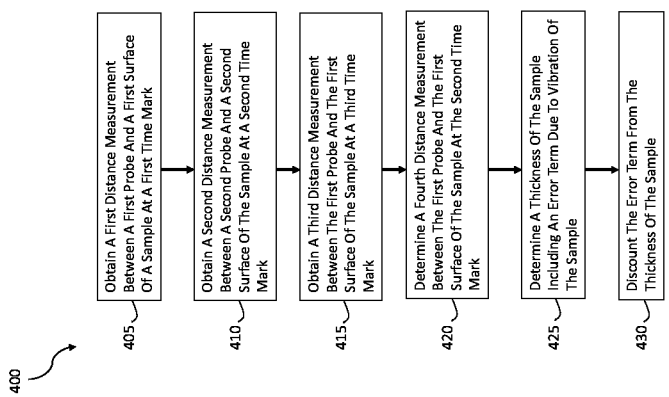
FIG. 4 illustrates a flowchart of an example method to increase measurement accuracy of a sample.

FIG. 4 is a flowchart of an example method 400 to increase measurement accuracy of a sample. The method 400 may be arranged in accordance with at least one embodiment described in the present disclosure. The method 400 may be performed, in some embodiments, by a device or system, such as the spectrometer 104 of FIG. 1 or the computing system 108 of FIG. 1, or another device or system. In these and other embodiments, the method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

At block 405 of the method 400, a first distance measurement may be obtained between a first probe and a first surface of a sample at a first time mark. In these or other embodiments, the first time mark may be represented as time t=0.

At block 410, a second distance measurement may be obtained between a second probe and a second surface of the sample at a second time mark. In these or other embodiments, the second surface may be opposite the first surface. In some embodiments, obtaining the second distance measurement may include using the Taylor series to account for vibration of the sample. Additionally or alternatively, the second time mark may be represented as time t=Δt, and the second distance measurement may be represented as $$H2(\Delta t) = H2_0 - v*\Delta t - \frac{a*\Delta t^2}{2} + \ldots .$$

In these or other embodiments, terms of the second distance measurement may include the following: $H2_0$ may represent a benchmark distance between the second probe and the second surface of the sample at time t=0; v*Δt may represent a velocity term that includes the velocity of the sample at time t=Δt relative to the second probe;

$$\frac{a\Delta t^2}{2}$$

may represent an acceleration term that includes the acceleration of the sample at time t=Δt relative to the second probe; * may represent a scalar multiplier; and . . . may represent additional terms of a Taylor series approximation. In some embodiments, the second distance measurement may include one or both of real-space components and frequency domain components.

At block 415, a third distance measurement may be obtained between the first probe and the first surface of a sample at a third time mark. In some embodiments, obtaining the third distance measurement may include using the Taylor series to account for vibration of the sample. Additionally or alternatively, the third time mark may be represented as time t=2Δt, and the third distance measurement is represented as $$H1(2\Delta t) = H1_0 + v*2\Delta t + \frac{a*(2\Delta t)^2}{2} + \ldots .$$

In these or other embodiments, terms of the third distance measurement may include the following: $H1_0$ may represent the first distance measurement, which is a benchmark distance between the first probe and the first surface of the sample at time t=0; v*2Δt may represent a velocity term that includes the velocity of the sample at time t=2Δt relative to the first probe; and $$\frac{a(2\Delta t)^2}{2}$$

may represent an acceleration term that includes the acceleration of the sample at time t=2Δt relative to the first probe.

In some embodiments, the third distance measurement may include one or both of real-space components and frequency domain components.

At block 420, a fourth distance measurement may be determined between the first probe and the first surface of the sample at the second time mark. In some embodiments, obtaining the fourth distance measurement may include using the Taylor series to account for vibration of the sample. Additionally or alternatively, the fourth distance measurement may be represented as $$H1(\Delta t) = \frac{H1_0 + H1(2\Delta t)}{2}.$$

In these or other embodiments, the fourth distance measurement may include one or both of real-space components and frequency domain components.

At block 425, a thickness of the sample may be determined, including an error term due to vibration of the sample. In some embodiments, the thickness of the sample may be represented as $$T_{ap} = H - \left[(H1_0 + H2_0) + \frac{a(\Delta t)^2}{2}\right].$$

In these or other embodiments, terms of the thickness of the sample may include the following: H may represent the probe separation distance;

$$\frac{a(\Delta t)^2}{2}$$

may represent the error term due to vibration of the sample; and $$\left[(H1_0 + H2_0) + \frac{a(\Delta t)^2}{2}\right]$$

may represent the sum of the fourth distance measurement and the second distance measurement. At block 430, the error term may be discounted from the thickness of the sample.

It is understood that, for this and other processes, operations, and methods disclosed in this disclosure, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments. For example, in some embodiments, the spectrometer in the method 400 may be a sole spectrometer. Additionally or alternatively, the first probe and the second probe may be communicatively coupled to the sole spectrometer via a micro-electro-mechanical systems (MEMS) switch. In another example, vibration of the sample in the method 400 may include harmonic motion.

In yet another example of the method 400, one or more processors may be configured to receive a preset range of one or both of acceptable values and unacceptable values of the thickness of the sample, an acceptability or non-acceptability of the sample based on the preset range of one or both of acceptable values and unacceptable values, and the preset range of one or both of acceptable values and unacceptable values enabling the one or more processors to sort samples according to acceptability and non-acceptability of the samples. In a further example of the method 400, the one or more processors may be configured to receive a preset range of one or both of acceptable values and unacceptable values of the thickness of the sample, an acceptability or non-acceptability of the sample based on the preset range of one or both of acceptable values and unacceptable values, and the preset range of one or both of acceptable values and unacceptable values enabling the one or more processors to sort samples according to thickness of the samples.

As indicated above, the embodiments described in this disclosure may include the use of a special purpose or general purpose computer (e.g., the processor 110 of FIG. 1) including various computer hardware or software modules, as discussed in greater detail below. Further, as indicated above, embodiments described in this disclosure may be implemented using computer-readable media (e.g., the memory 112 of FIG. 1) for carrying or having computer-executable instructions or data structures stored thereon.

In some embodiments, the different components, modules, engines, and services described in this disclosure may be implemented as objects or processes that execute on a computing system (e.g., as separate threads). While some of the systems and methods described in this disclosure are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used in this disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used in this disclosure to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in this disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

The invention claimed is:

1. A method to increase measurement accuracy of a sample, the method comprising:
  obtaining, from a spectrometer, a first distance measurement between a first probe and a first surface of a sample at a first time mark, the first probe communicatively coupled to the spectrometer;
  obtaining, from the spectrometer, a second distance measurement between a second probe and a second surface of the sample at a second time mark that is chronologically after the first time mark, the second distance measurement including velocity and acceleration of the sample at the second time mark relative to the second probe communicatively coupled to the spectrometer;
  obtaining, from the spectrometer, a third distance measurement between the first probe and the first surface of the sample at a third time mark that is chronologically after both of the first time mark and the second time mark, the third distance measurement including velocity and acceleration of the sample at the third time mark relative to the first probe;
  determining a fourth distance measurement between the first probe and the first surface of the sample at the second time mark by averaging the first distance measurement and the third distance measurement, the fourth distance measurement including velocity and acceleration of the sample at the second time mark relative to the first probe;
  determining a thickness of the sample by subtracting the sum of the fourth distance measurement and the second distance measurement from a probe separation distance, the probe separation distance a predetermined distance between the first probe and the second probe, and the thickness of the sample including an error term due to vibration of the sample; and
  discounting the error term from the thickness of the sample to improve estimation accuracy of the thickness of the sample.

2. The method of claim 1, wherein obtaining one or more of the second distance measurement, the third distance measurement, and the fourth distance measurement includes using the Taylor series to account for the vibration of the sample.

3. The method of claim 1, wherein the first time mark is represented as time t=0, the second time mark is represented as time t=Δt, and the second distance measurement is represented as follows:

$$H2(\Delta t) = H2_0 - v*\Delta t - \frac{a*\Delta t^2}{2} + \dots,$$

wherein $H2_0$ represents a benchmark distance between the second probe and the second surface of the sample at time t=0,
wherein v*Δt represents a velocity term that includes the velocity of the sample at time t=Δt relative to the second probe,
wherein $$\frac{a\Delta t^2}{2}$$

represents an acceleration term that includes the acceleration of the sample at time t=Δt relative to the second probe,
wherein * represents a scalar multiplier, and
wherein . . . represents additional terms of a Taylor series approximation.

4. The method of claim 3, wherein the third time mark is represented as time t=2Δt and the third distance measurement is represented as follows:

$$H1(2\Delta t) = H1_0 + v*2\Delta t + \frac{a*(2\Delta t)^2}{2} + \dots,$$

wherein $H1_0$ represents the first distance measurement, which is a benchmark distance between the first probe and the first surface of the sample at time t=0, wherein v*2Δt represents a velocity term that includes the velocity of the sample at time t=2Δt relative to the first probe, and
wherein $$\frac{a(2\Delta t)^2}{2}$$

represents an acceleration term that includes the acceleration of the sample at time t=2Δt relative to the first probe.

5. The method of claim 4, wherein the fourth distance measurement is represented as follows:

$$H1(\Delta t) = \frac{H1_0 + H1(2\Delta t)}{2}.$$

6. The method of claim 5, wherein the thickness of the sample is represented as follows:

$$T_{ap} = H - \left[ (H1_0 + H2_0) + \frac{a(\Delta t)^2}{2} \right],$$

wherein H represents the probe separation distance, wherein $$\frac{a(\Delta t)^2}{2}$$

represents the error term due to vibration of the sample, and wherein $$\left[ (H1_0 + H2_0) + \frac{a(\Delta t)^2}{2} \right]$$

represents the sum of the fourth distance measurement and the second distance measurement.

7. The method of claim 1, wherein obtaining one or more of the second distance measurement, the third distance measurement, and the fourth distance measurement includes one or both of real-space components and frequency domain components.

8. The method of claim 1, wherein:
the spectrometer is a sole spectrometer; and
the first probe and the second probe are communicatively coupled to the sole spectrometer via a micro-electro-mechanical systems (MEMS) switch.

9. A non-transitory computer-readable medium having encoded therein programming code executable by one or more processors to perform or control performance of operations comprising:
obtaining, from a spectrometer, a first distance measurement between a first probe and a first surface of a sample at a first time mark, the first probe communicatively coupled to the spectrometer;
obtaining, from the spectrometer, a second distance measurement between a second probe and a second surface of the sample at a second time mark that is chronologically after the first time mark, the second distance measurement including velocity and acceleration of the sample at the second time mark relative to the second probe communicatively coupled to the spectrometer;
obtaining, from the spectrometer, a third distance measurement between the first probe and the first surface of the sample at a third time mark that is chronologically after both of the first time mark and the second time mark, the third distance measurement including velocity and acceleration of the sample at the third time mark relative to the first probe;
determining a fourth distance measurement between the first probe and the first surface of the sample at the second time mark by averaging the first distance measurement and the third distance measurement, the fourth distance measurement including velocity and acceleration of the sample at the second time mark relative to the first probe;
determining a thickness of the sample by subtracting the sum of the fourth distance measurement and the second distance measurement from a probe separation distance, the probe separation distance a predetermined distance between the first probe and the second probe, and the thickness of the sample including an error term due to vibration of the sample; and
discounting the error term from the thickness of the sample to improve estimation accuracy of the thickness of the sample.

10. The non-transitory computer-readable medium of claim 9, wherein obtaining one or more of the second distance measurement, the third distance measurement, and the fourth distance measurement includes using the Taylor series to account for the vibration of the sample.

11. The non-transitory computer-readable medium of claim 9, wherein the first time mark is represented as time t=0, the second time mark is represented as time t=Δt, and the second distance measurement is represented as follows:

$$H2(\Delta t) = H2_0 - v*\Delta t - \frac{a*\Delta t^2}{2} + \ldots,$$

wherein $H2_0$ represents a benchmark distance between the second probe and the second surface of the sample at time t=0,
wherein v*Δt represents a velocity term that includes the velocity of the sample at time t=Δt relative to the second probe,
wherein $$\frac{a\Delta t^2}{2}$$

represents an acceleration term that includes the acceleration of the sample at time t=Δt relative to the second probe,
wherein * represents a scalar multiplier, and
wherein . . . represents additional terms of a Taylor series approximation.

12. The non-transitory computer-readable medium of claim 11, wherein the third time mark is represented as time t=2Δt and the third distance measurement is represented as follows:

$$H1(2\Delta t) = H1_0 + v*2\Delta t + \frac{a*(2\Delta t)^2}{2} + \ldots,$$

wherein $H1_0$ represents the first distance measurement, which is a benchmark distance between the first probe and the first surface of the sample at time t=0, wherein v*2Δt represents a velocity term that includes the velocity of the sample at time t=2Δt relative to the first probe, and wherein $$\frac{a(2\Delta t)^2}{2}$$

represents an acceleration term that includes the acceleration of the sample at time t=2Δt relative to the first probe.

13. The non-transitory computer-readable medium of claim 12, wherein the fourth distance measurement is represented as follows:

$$H1(\Delta t) = \frac{H1_0 + H1(2\Delta t)}{2}.$$

14. The non-transitory computer-readable medium of claim 13, wherein the thickness of the sample is represented as follows:

$$T_{ap} = H - \left[ (H1_0 + H2_0) + \frac{a(\Delta t)^2}{2} \right],$$

wherein H represents the probe separation distance, wherein $$\frac{a(\Delta t)^2}{2}$$

represents the error term due to vibration of the sample, and wherein $$\left[ (H1_0 + H2_0) + \frac{a(\Delta t)^2}{2} \right]$$

represents the sum of the fourth distance measurement and the second distance measurement.

15. The non-transitory computer-readable medium of claim 9, wherein obtaining one or more of the second distance measurement, the third distance measurement, and the fourth distance measurement includes one or both of real-space components and frequency domain components.

16. The non-transitory computer-readable medium of claim 9, wherein:
the spectrometer is a sole spectrometer; and
the first probe and the second probe are communicatively coupled to the sole spectrometer via a micro-electro-mechanical systems (MEMS) switch.

17. A system comprising:
a spectrometer; and
one or more processors configured to perform or control performance of operations comprising:
obtaining, from the spectrometer, a first distance measurement between a first probe and a first surface of a sample at a first time mark, the first probe communicatively coupled to the spectrometer;
obtaining, from the spectrometer, a second distance measurement between a second probe and a second surface of the sample at a second time mark that is chronologically after the first time mark, the second distance measurement including velocity and acceleration of the sample at the second time mark relative to the second probe communicatively coupled to the spectrometer;
obtaining, from the spectrometer, a third distance measurement between the first probe and the first surface of the sample at a third time mark that is chronologically after both of the first time mark and the second time mark, the third distance measurement including velocity and acceleration of the sample at the third time mark relative to the first probe;
determining a fourth distance measurement between the first probe and the first surface of the sample at the second time mark by averaging the first distance measurement and the third distance measurement, the fourth distance measurement including velocity and acceleration of the sample at the second time mark relative to the first probe;
determining a thickness of the sample by subtracting the sum of the fourth distance measurement and the second distance measurement from a probe separation distance, the probe separation distance a predetermined distance between the first probe and the second probe, and the thickness of the sample including an error term due to vibration of the sample; and
discounting the error term from the thickness of the sample to improve estimation accuracy of the thickness of the sample.

18. The system of claim 17, wherein:
the spectrometer is a sole spectrometer; and
the first probe and the second probe are communicatively coupled to the sole spectrometer via a micro-electro-mechanical systems (MEMS) switch.

19. The system of claim 17, wherein one or more of the second distance measurement, the third distance measurement, and the fourth distance measurement includes one or both of real-space components and frequency domain components.

20. The system of claim 17, wherein vibration of the sample includes harmonic motion.

21. The system of claim 17, wherein the one or more processors are configured to receive a preset range of one or both of acceptable values and unacceptable values of the thickness of the sample, an acceptability or non-acceptability of the sample based on the preset range of one or both of acceptable values and unacceptable values, and the preset range of one or both of acceptable values and unacceptable values enabling the one or more processors to sort samples according to acceptability and non-acceptability of the samples.

22. The system of claim 17, wherein the one or more processors are configured to receive a preset range of one or both of acceptable values and unacceptable values of the thickness of the sample, an acceptability or non-acceptability of the sample based on the preset range of one or both of acceptable values and unacceptable values, and the preset range of one or both of acceptable values and unacceptable values enabling the one or more processors to sort samples according to thickness of the samples.

* * * * *